United States Patent
Yang et al.

(10) Patent No.: US 11,444,241 B2
(45) Date of Patent: Sep. 13, 2022

(54) SELF-ALIGNED ENCAPSULATION HARD MASK TO SEPARATE PHYSICALLY UNDER-ETCHED MTJ CELLS TO REDUCE CONDUCTIVE R-DEPOSITION

(71) Applicant: Taiwan Semiconductor Manufacturing Company, Ltd., Hsinchu (TW)

(72) Inventors: Yi Yang, Fremont, CA (US); Dongna Shen, San Jose, CA (US); Vignesh Sundar, Fremont, CA (US); Yu-Jen Wang, San Jose, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/121,457

(22) Filed: Dec. 14, 2020

(65) Prior Publication Data
US 2021/0098696 A1 Apr. 1, 2021

Related U.S. Application Data

(63) Continuation of application No. 16/113,079, filed on Aug. 27, 2018, now Pat. No. 10,868,237.

(51) Int. Cl.
*H01L 43/12* (2006.01)
*H01L 43/02* (2006.01)
(Continued)

(52) U.S. Cl.
CPC .......... *H01L 43/12* (2013.01); *H01F 10/3254* (2013.01); *H01F 41/34* (2013.01);
(Continued)

(58) Field of Classification Search
CPC .......... H01L 21/28141; H01L 29/0653; H01L 29/6653; H01L 29/66553; H01L 29/6656;
(Continued)

(56) References Cited

U.S. PATENT DOCUMENTS 8,883,520 B2 11/2014 Satoh et al.
9,502,466 B1 11/2016 Chuang et al.
(Continued)

FOREIGN PATENT DOCUMENTS

JP 2004128229 A 4/2004
KR 20120009808 A 2/2012
(Continued)

OTHER PUBLICATIONS

Korean Intellectual Property Office, Korean Office Action dated Oct. 23, 2020, for Application No. 10-2019-0104731, filed Aug. 26, 2019, Applicant: Taiwan Semiconductor Manufacturing Company, Ltd., 5 pages.

*Primary Examiner* — David C Spalla
(74) *Attorney, Agent, or Firm* — Haynes and Boone, LLP

(57) ABSTRACT

A method for etching a magnetic tunneling junction (MTJ) structure is described. A MTJ stack is deposited on a bottom electrode wherein the MTJ stack comprises at least a pinned layer, a barrier layer on the pinned layer, and a free layer on the barrier layer, A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned layer. Thereafter, an encapsulation layer is deposited over the partially etched MTJ stack and etched away on horizontal surfaces leaving a self-aligned hard mask on sidewalls of the partially etched
(Continued)

MTJ stack. Finally, the remaining MTJ stack not covered by hard mask and self-aligned hard mask is etched to complete the MTJ structure.

20 Claims, 2 Drawing Sheets

(51) Int. Cl.
    *H01F 41/34* (2006.01)
    *H01F 10/32* (2006.01)
    *G11C 11/16* (2006.01)
    *H01L 27/22* (2006.01)

(52) U.S. Cl.
    CPC ............ *H01L 43/02* (2013.01); *G11C 11/161* (2013.01); *H01L 27/222* (2013.01)

(58) Field of Classification Search
    CPC ......... H01L 43/02; H01L 43/08; H01L 43/10; H01L 43/12; H01F 10/3254; H01F 41/32; H01F 41/34; G11C 11/161
    See application file for complete search history.

(56) References Cited

U.S. PATENT DOCUMENTS

| | | | |
|---|---|---|---|
| 9,722,174 B1 | 8/2017 | Nagel et al. | |
| 9,793,126 B2 | 10/2017 | Dhindsa et al. | |
| 9,972,777 B1 | 5/2018 | Haq et al. | |
| 2006/0261425 A1* | 11/2006 | Suemitsu | H01L 43/08 |
| | | | 257/E27.005 |
| 2012/0018826 A1 | 1/2012 | Lee et al. | |
| 2013/0201757 A1 | 8/2013 | Li et al. | |
| 2015/0061052 A1* | 3/2015 | Huang | H01L 43/02 |
| | | | 257/421 |
| 2016/0225981 A1 | 8/2016 | Deshpande et al. | |
| 2017/0062699 A1 | 3/2017 | Huang et al. | |
| 2017/0125668 A1 | 5/2017 | Paranjpe et al. | |
| 2017/0301857 A1 | 10/2017 | Mudivarthi et al. | |
| 2018/0358547 A1 | 12/2018 | Yang et al. | |
| 2019/0214554 A1* | 7/2019 | Li | G11C 11/1675 |
| 2020/0066972 A1 | 2/2020 | Yang et al. | |

FOREIGN PATENT DOCUMENTS

| | | |
|---|---|---|
| KR | 20180063183 A | 6/2018 |
| TW | 201742241 A | 12/2017 |

* cited by examiner

SELF-ALIGNED ENCAPSULATION HARD MASK TO SEPARATE PHYSICALLY UNDER-ETCHED MTJ CELLS TO REDUCE CONDUCTIVE R-DEPOSITION

PRIORITY DATA

The present application is a continuation application of U.S. application Ser. No. 16/113,079, filed Aug. 27, 2018, which is herein incorporated by reference in its entirety.

TECHNICAL FIELD

This application relates to the general field of magnetic tunneling junctions (MTJ) and, more particularly, to etching methods for forming MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another.

However, the high energy ions can also react with the non-removed materials, oxygen, moisture and other chemicals laterally, causing sidewall damage and lowering device performance. To solve this issue, pure physical etching techniques such as Ar RIE or ion beam etching (IBE) have been applied to etch the MTJ stack. However, due to the non-volatile nature, physically etched conductive materials in the MTJ and bottom electrode can form a continuous path across the tunnel barrier, resulting in shorted devices. A new approach to overcome this dilemma is thus needed if one wants to unleash the full potential of this physical etch to pattern the future sub 60 nm MRAM products.

Several references teach multi-step etching methods to form MTJ's, including U.S. Pat. No. 9,793,126 (Dhindsa et al), U.S. Pat. No. 9,722,174 (Nagel et al), and U.S. Pat. No. 8,883,520 (Satoh et al). All of these references are different from the present disclosure.

SUMMARY

It is an object of the present disclosure to provide an improved method of forming MTJ structures.

Yet another object of the present disclosure is to provide a method of forming MTJ devices using a physical under-etch to avoid both chemical damage and physical shorts.

A further object of the present disclosure is to provide a method of forming MTJ devices using a physical underetch to avoid both chemical damage and physical shorts where separate and non-interacting MTJ cells are made using encapsulation material as a self-aligned process.

In accordance with the objectives of the present disclosure, a method for etching a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A hard mask is deposited on the top electrode layer. The top electrode layer and hard mask are etched. Thereafter, the MTJ stack not covered by the hard mask is etched, stopping at or within the pinned or the seed layer. Thereafter, an encapsulation layer is deposited over the partially etched MTJ stack and etched away on horizontal surfaces leaving a self-aligned hard mask on sidewalls of the partially etched MTJ stack. Finally, the remaining MTJ stack not covered by hard mask and self-aligned hard mask is etched to complete the MTJ structure.

BRIEF DESCRIPTION OF THE DRAWINGS

In the accompanying drawings forming a material part of this description, there is shown.

DETAILED DESCRIPTION

In a typical process, the whole MTJ stack is patterned by a single step of etch, either by chemical RIE or physical Ar RIE or IBE. It therefore creates either chemical damage or physical shorts on the MTJ sidewall. In the process of the present disclosure, we first partially etch the MTJ stack to minimize the physical re-deposition. Then, using encapsulation material as a self-aligned hard mask, the remaining MTJ is etched. This new process avoids chemical damage and physical shorts simultaneously. Moreover, the second step of etch is a self-aligned process, meaning it does not require a complicated photolithography step, where the overlay is hard to control, especially for sub 60 nm MRAM devices.

In the process of the present disclosure, the MTJ stack is first partially etched by a physical etch such as RIE or IBE using different gas plasma such as Ar and Xe, so that there is no chemical damage but only conductive re-deposition on the sidewall. The amount of re-deposition is dependent on the etch amount. By intentionally under etching, e.g., only etching away the free layer, tunnel barrier and/or part of the pinned or the seed layer, the re-deposition on the tunnel barrier sidewall can be significantly reduced or totally removed. An encapsulation material is deposited to protect the earlier etched MTJ. A RIE or IBE etch partially clears out the portion of encapsulation material that is on top and bottom of the MTJ patterns. Next, using the encapsulation material left on the MTJ sidewalls as a self-aligned hard mask, the remaining MTJ is etched, creating separate and non-interacting MTJ cells. Regardless of what type of etch is used, the free layer and tunnel barrier layer would not be affected by this step due to the encapsulation material's protection, thus preserving high device performance.

Figure 1:
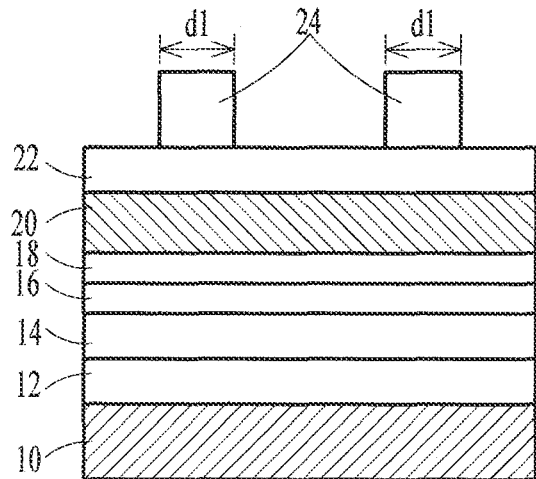
FIGS. 1 through 6 illustrate in cross-sectional representation steps in a preferred embodiment of the present disclosure.

Referring now to FIGS. 1 through 6, the novel method of the present disclosure will be described in detail. Referring now more particularly to FIG. 1, there is shown a bottom electrode 10 formed on a substrate, not shown. Now, layers are deposited on the bottom electrode to form a magnetic tunnel junction. For example, seed layer 12, pinned layer 14, tunnel barrier layer 16, and free layer 18 are deposited.

There may be one or more pinned, barrier, and/or free layers. A metal hard mask 20, such as Ta, TaN, Ti, TiN, W, Cu, Mg, Ru, Cr, Co, Fe, Ni or their alloys, is deposited to a thickness of 10-100 nm, and preferably 50 nm, on top of the MTJ stack. This hard mask will be used as a top electrode. Finally, a dielectric hard mask material 22, such as $SiO_2$, SiN, SiON, SiC or SiCN, is deposited to a thickness of 20 nm onto the top electrode 20. Photoresist is patterned by 248 nm photolithography, for example, to form photoresist pillar patterns 24 with size d1 of ~70-80 nm and height 200 nm.

Figure 2:
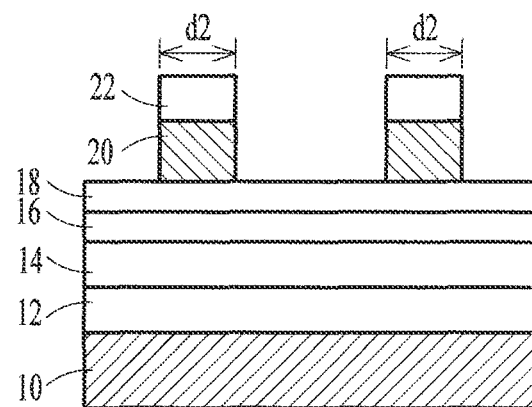

Now, as illustrated in FIG. 2, the dielectric and metal hard masks 22 and 20 are etched by a fluorine carbon based plasma such as $CF_4$ or $CHF_3$ alone, or mixed with Ar and $N_2$. $O_2$ can be added to reduce the pillar size d2 from 50-60 nm to 30-40 nm. They can also be etched by physical RIE or IBE (pure Ar), followed by large angle (70-90° with respect to the pillar's normal line) IBE trimming, forming pillar size d2 of 30-40 nm.

Figure 3:
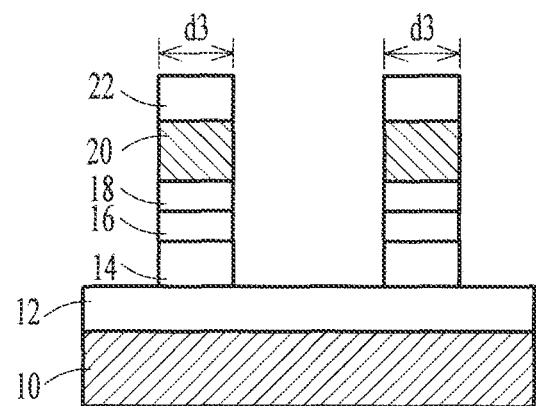

Referring now to FIG. 3, the MTJ stack is partially etched using physical RIE (pure Ar or Xe) or IBE stopping either on the pinned layer or the seed layer with similar pattern size, to minimize the metal re-deposition on the tunnel barrier. Because of the nature of a physical etch, there is no chemical damage. The height h of the partially etched MTJ stack is between about 5 and 30 nm.

Figure 4:
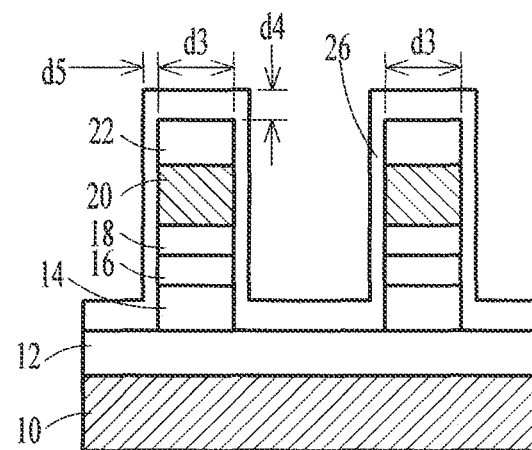
Figure 5:
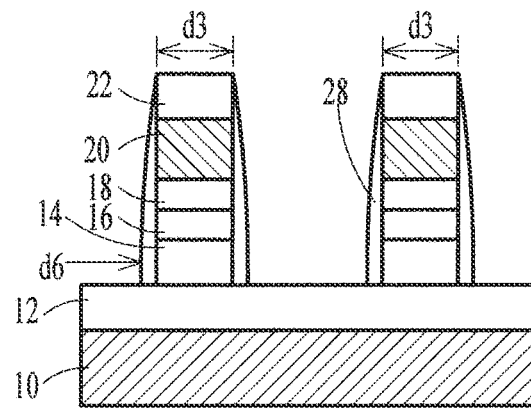

Now, as illustrated in FIG. 4, an encapsulation material 26 made of dielectric materials such as SiN, SiC, SiCN, carbon, or TaC or metal oxides such as $Al_2O_3$ or MgO with thickness d4 of 5-30 nm, is either in-situ or ex-situ deposited by CVD, PVD or ALD onto the partially etched MTJ patterns. The portion of the encapsulation material on top and bottom of the patterns is etched away by RIE or IBE, leaving encapsulation spacers 28 on the sidewalls, as shown in FIG. 5, having a thickness d6 of 10-30 nm. Depending on the material used for the spacer, different plasma can be used for this etching step. For example, a fluorine carbon based plasma such as $CF_4$ or $CHF_3$ can be used for SiN, SiC, and SiCN, $O_2$ can be applied for carbon, a fluorine carbon such as $CF_4$ or $CHF_3$ or a halogen such as $Cl_2$, or their combination, can be used for TaC, and a halogen such as $Cl_2$ alone or mixed with Ar can be used for $Al_2O_3$ and MgO.

Figure 6:
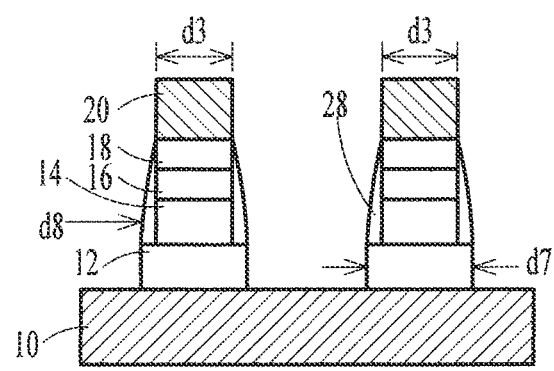

Finally using the encapsulation 28 left on the sidewalls of the MTJ patterns as a self-aligned hard mask, as shown in FIG. 6, the remaining MTJ stack such as the pinned layer 14 and/or seed layer 12 can be etched by RIE or IBE. When a RIE etch is used, since the pinned layer and seed layer fabricated by this method are larger than the free layer, the chemical damage on the pinned layer and seed layer would not affect its central portion which is aligned with the free layer. When physical RIE or IBE is used, the metal re-deposition from the pinned and seed layers would not be in contact with the tunnel barrier due to the encapsulation's protection. Note that this pinned and seed layer etch is a self-aligned step, meaning it has no overlay control issue, which is usually associated with sub 60 nm MRAM device fabrication.

More importantly, the pinned and seed layers' sizes are greatly dependent on the thickness of the encapsulation sidewall serving as the hard mask, which is determined by its initial deposition thickness and later etch conditions. By tuning these parameters, one can precisely control the pinned and seed layers' sizes according to the device design. For instance, one can create a thick spacer having a thickness d8 of 10-20 nm on the free layer's sidewall so that the later defined tunnel barrier and pinned layers are of the size d7 of 50-60 nm, larger than the free layer d3 of 40-50 nm. This is particularly critical for small cell size devices since it allows for strong pinning strength, increasing the energy barrier and reducing the switching current.

In summary, the process of the present disclosure uses a physical under etch to avoid both chemical damage and physical shorts. Moreover, separate and non-interacting MTJ cells are made using encapsulation material as a self-aligned process, meaning it has no overlay control issue, which is usually associated with sub 60 nm MRAM device fabrication. It is thus possible to replace the widely used chemical RIE etch, which inevitably brings chemical damage on the MTJ sidewall. This process will be used for MRAM chips of the size smaller than 60 nm as problems associated with chemically damaged sidewalls and re-deposition from the MTJ stack and bottom electrode become very severe for the smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method comprising:
    forming a stack of magnetic tunneling junction (MTJ) layers over a bottom electrode;
    forming a top electrode layer on the stack of MTJ layers;
    forming a hard mask on the top electrode layer;
    patterning the top electrode layer while using the hard mask as a mask;
    patterning a first portion of the stack of MTJ layers while using the hard mask as a mask such that a second portion of the stack of MTJ layers is not patterned by the patterning of the first portion of the stack of MTJ layers;
    forming an encapsulation layer over the patterned first portion of stack of MTJ layers, the second portion of the stack of MTJ layers and the hard mask;
    removing a portion of the encapsulation layer thereby forming a self-aligned hard mask on sidewalls of the patterned first portion of the stack of MTJ layers; and
    patterning the second portion of the stack of MTJ layers while using the hard mask and the self-aligned hard mask as a mask, wherein the patterning of the second portion of the stack of MTJ layers while using the hard mask and the self-aligned hard mask as the mask includes removing a portion of the self-aligned hard mask to expose a sidewall surface of the patterned top electrode layer.

2. The method of claim 1, wherein the second portion of the stack of MTJ layers includes a seed layer.

3. The method of claim 1, wherein the patterned first portion of the stack of MTJ layers includes a tunnel barrier layer and a free layer.

4. The method of claim 1, wherein the forming of the encapsulation layer over the patterned first portion of stack of MTJ layers, the second portion of the stack of MTJ layers and the hard mask includes forming the encapsulation layer directly on the patterned first portion of stack of MTJ layers, the second portion of the stack of MTJ layers and the hard mask.

5. The method of claim 1, wherein a top surface of the hard mask is covered by the encapsulation layer after the forming of the encapsulation layer over the patterned first portion of stack of MTJ layers, the second portion of the stack of MTJ layers and the hard mask.

6. The method of claim 5, wherein the top surface of the hard mask is exposed after the removing of the portion of the encapsulation layer.

7. The method of claim 1, wherein the patterning of the second portion of the stack of MTJ layers exposes a top surface of the bottom electrode.

8. The method of claim 1, wherein the patterning of the top electrode layer includes applying a halogen-based plasma process, wherein the patterning of the first portion of the stack of MTJ layers includes applying a first reactive ion etching process or a first ion beam etching process, and
wherein the patterning of the second portion of the stack of MTJ layers includes applying a second reactive ion etching process or a second ion beam etching process.

9. The method of claim 1, wherein the removing of the portion of the encapsulation layer includes:
applying a reactive ion etching process or an ion beam etching process to remove a first part of the portion of the encapsulation layer; and
applying a halogen-based plasma process to remove a second part of the portion of the encapsulation layer.

10. A method comprising:
forming a stack of magnetic tunneling junction (MTJ) layers over a bottom electrode;
forming a top electrode layer on the stack of MTJ layers;
patterning the top electrode layer;
patterning a first portion of the stack of MTJ layers while using the patterned top electrode layer as a mask, wherein a second portion of the stack of MTJ layers covers a top surface of the bottom electrode after the patterning of the first portion of the stack of MTJ layers;
forming an encapsulation layer directly on the patterned first portion of stack of MTJ layers and the second portion of the stack of MTJ layers;
removing a portion of the encapsulation layer to thereby form a spacer on a sidewall of the patterned first portion of the stack of MTJ layers; and
patterning the second portion of the stack of MTJ layers while using the spacer as a mask, wherein the patterning of the second portion of the stack of MTJ layers while using the spacer as the mask includes removing a first portion of the spacer to expose a sidewall surface of the patterned top electrode layer.

11. The method of claim 10, wherein the patterning of the second portion of the stack of MTJ layers exposes the top surface of the bottom electrode.

12. The method of claim 10, wherein the second portion of the stack of MTJ layers has a top surface facing away from the bottom electrode, and
wherein the forming of the encapsulation layer directly on the second portion of the stack of MTJ layers includes forming the encapsulation layer directly on the top surface of the second portion of the stack of MTJ layers.

13. The method of claim 12, wherein the top surface of the second portion of the stack of MTJ layers is defined by a seed layer.

14. The method of claim 10, further comprising forming a patterned hard mask layer on the top electrode layer, and
wherein the forming of the encapsulation layer directly on the patterned first portion of stack of MTJ layers and the second portion of the stack of MTJ layers further includes forming the encapsulation layer directly on the patterned hard mask layer.

15. The method of claim 10, wherein the removing of the portion of the encapsulation layer to thereby form the spacer on the sidewall of the patterned first portion of the stack of MTJ layers includes removing, via a first removal process, a first part of the portion of the encapsulation layer to expose a top surface of the patterned hard mask layer; and
wherein the patterning of the second portion of the stack of MTJ layers while using the spacer as the mask includes removing, via a second removal process, the first portion of the spacer to expose the sidewall surface of the patterned top electrode layer, the second removal process being different than the first removal process.

16. The method of claim 15, wherein a second portion of the spacer remains disposed on the sidewall of the patterned first portion of the stack of MTJ layers after removing, via the second removal process, the first portion of the spacer to expose the sidewall surface of the patterned top electrode layer.

17. A magnetic tunneling junction (MTJ) structure comprising:
a first MTJ cell disposed on a bottom electrode, the first MTJ cell including:
a seed layer, a pinned layer, a barrier layer and a free layer, wherein the seed layer has a top surface facing away from the bottom electrode;
a sidewall spacer disposed along and physically contacting sidewalls of the pinned layer, the barrier layer and the free layer, wherein the sidewall spacer extends to and physically contacts the top surface of the seed layer; and
a top electrode disposed over and having a bottom surface facing the free layer, the bottom surface of the top electrode extending between opposing sidewalls of the top electrode and at least a portion of the opposing sidewalls of the top electrode being free of the sidewall spacer.

18. The MTJ structure of claim 17, wherein the seed layer is wider than each of the pinned layer, the barrier layer and the free layer, and
wherein the pinned layer, the barrier layer and the free layer each have substantially the same width.

19. The MTJ structure of claim 17, further comprising a second MTJ cell on the bottom electrode, the second MTJ cell being spaced apart from the first MTJ cell on the bottom electrode.

20. The MTJ structure of claim 18, wherein sidewall spacer includes an upper portion and a lower portion, the upper portion being further away from the bottom electrode than the lower portion and having a first thickness, the lower portion being closer to the bottom electrode than the upper portion and having a second thickness that is greater than the first thickness.

* * * * *